(12) United States Patent
Augur et al.

(10) Patent No.: US 7,235,867 B1
(45) Date of Patent: Jun. 26, 2007

(54) SEMICONDUCTOR DEVICE WITH ELECTRICALLY BIASED DIE EDGE SEAL

(75) Inventors: Roderick A. Augur, Hopewell Junction, NY (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 184 days.

(21) Appl. No.: 10/976,876

(22) Filed: Nov. 1, 2004

(51) Int. Cl.
*H01L 23/552* (2006.01)
*H01L 23/04* (2006.01)

(52) U.S. Cl. .................. 257/659; 257/660; 257/730; 257/E23.193

(58) Field of Classification Search ............. 257/659, 257/660, 730; 361/818
See application file for complete search history.

(56) References Cited

U.S. PATENT DOCUMENTS

| 4,656,055 | A | * | 4/1987 | Dwyer ..................... 438/510 |
| 2002/0152925 | A1 | * | 10/2002 | Soutar et al. ............. 106/1.22 |
| 2005/0095835 | A1 | * | 5/2005 | Humpston et al. ......... 438/613 |
| 2006/0055007 | A1 | * | 3/2006 | Yao et al. .................. 257/660 |

* cited by examiner

*Primary Examiner*—Nitin Parekh
(74) *Attorney, Agent, or Firm*—McDermott Will & Emery

(57) ABSTRACT

A die seal arrangement and method for making the same negatively biases the die edge seal of a die by connecting the die edge seal to a source of negative electrical potential, with respect to electrical ground. The die edge seal, made of copper, for example, has its oxidation reaction potential shifted to a region which is energetically unfavorable. This significantly retards or eliminates oxidation of the copper die edge seal at circuit operation temperature, thereby maintain the integrity and functionality of the die edge seal to protect active circuitry on the die, even when the die edge seal is exposed to moisture and air.

11 Claims, 2 Drawing Sheets

SEMICONDUCTOR DEVICE WITH ELECTRICALLY BIASED DIE EDGE SEAL

FIELD OF THE INVENTION

The present invention relates to the field of semiconductor device fabrication, and more particularly, to the protection of the circuitry of semiconductor devices from environmental effects.

BACKGROUND OF THE INVENTION

Monolithic integrated circuits are protected from ingress of ambient air and moisture by passivation layers above and die edge seals on the sides. When the circuit metal interconnect is made using copper (Cu) and the dual damascene process, the die edge seals most often take the form of a wall of metal extending from the substrate up to the top of the copper/dielectric stack and enclosing the active circuit elements.

In efforts to improve the operating performance of a chip, low k dielectric materials have been increasingly investigated for use as replacements for dielectric materials with higher k values. Lowering the overall k value of the dielectric layer employed in the metal interconnect layers lowers the RC of the chip and improves its performance. There are a number of concerns in using low k materials, such as being more difficult to handle than traditionally employed higher k materials, such as oxides.

In the manufacturing process, a semiconductor wafer contains a large number of main die areas. The semiconductor wafer is divided into the main die area (or circuits) using a sawing process, such as laser sawing or diamond sawing. The sawing takes place through the scribe line monitor area along saw lanes so as not to damage the functional circuitry contained within the main die area. Unfortunately, this process often results in cracking or delamination at the edge of the sliced circuit, especially at the corners of the die. The cracks are particularly harmful when low k dielectrics are used, due to reduced interface adhesion and increased susceptibility to ingress of water and/or ambient air. When such cracks propagate into the main die area, the functional circuitry may be compromised and rendered useless. This leads to a loss of yield and decreased productivity.

Even without cracks, water and air can diffuse through low k dielectrics. Consequently, the copper in the die edge seal is subject to oxidation, and consumed over the course of time. Once the copper metal is converted to oxide, water and air are able to move past the die edge seal and to interconnects between the active devices, causing device failure. In the presence of cracks and/or delamination, the ingress of water and/or ambient air will be faster.

SUMMARY OF THE INVENTION

There is a need for providing a methodology for making a semiconductor device that prevents the oxidation of the die edge seal, and thereby preserves the integrity of the die edge seal.

This and other needs are met by embodiments of the present invention which provide a die edge seal arrangement for a semiconductor device comprising a metallic edge seal surrounding active circuitry on a die, and a source of negative electrical potential with respect to electrical ground coupled to the edge seal to negatively bias the edge seal.

The arrangement mitigates the concern of oxidation of the die edge seal, and the use of copper in such a seal. By negatively biasing the die edge seal, the oxidation reaction potential is shifted to a region which is energetically unfavorable. Oxidation of the copper in the die edge seal can be significantly slowed down, or even stopped, at circuit operation temperature.

The earlier stated needs are also met by other embodiments of the present invention which provide a method of sealing the edge of a die, comprising the steps of forming a copper die edge seal at the periphery of the die, and retarding oxidation of the copper die edge seal.

The earlier stated needs are also met by other aspects of the present invention which provide a semiconductor device arrangement comprising a die having a die edge seal, and means for preventing oxidation of the die edge seal.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the protection of monolithic integrated circuits from ambient air and moisture, and in particular, to the preservation of the integrity of die edge seals. This is achieved, at least in part, for die edge seals by negatively biasing the die edge seal. In certain embodiments, the die edge seal is biased by connection to a source of negative electrical potential, with respect to electrical ground. The biasing of the die edge seal, which can be made of copper, shifts the oxidation reaction potential to a region that is energetically unfavorable. As a result, the oxidation of copper in the die edge seal is significantly slowed or even stopped, at circuit operation temperature, improving device reliability and longevity. The preservation of the die edge seal also obviates the need for multiple and/or wide die edge seals that are typically used to ensure overall current reliability. The elimination of multiple and/or wide die edge seals saves valuable area on the silicon wafer on which the circuits are fabricated and increases the area available for active circuitry, thereby increasing the yield of die per wafer.

Figure 1:
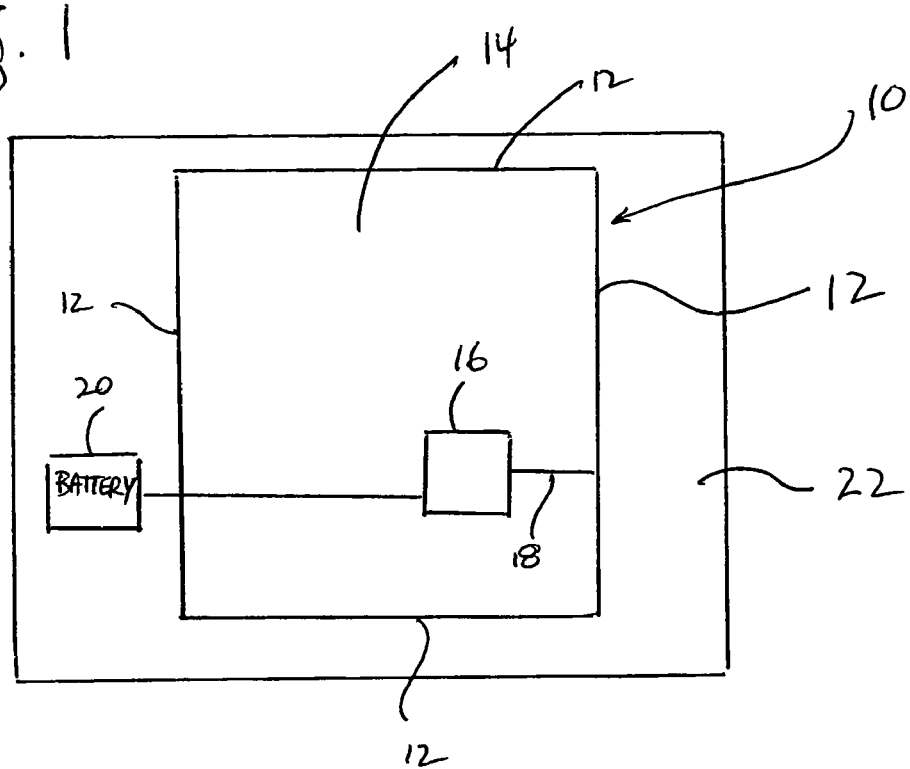
FIG. 1 is a top schematic view of a portion of a semiconductor device arrangement constructed in accordance with embodiments of the present invention.

FIG. 1 depicts a top view of a portion of a semiconductor device 10 which is formed in accordance with embodiments of the present invention. The semiconductor device 10 includes a die edge seal 12 at its periphery. The die edge seal 12 protects active circuitry 14 from ambient air and moisture. Typically, a passivation layer covers the die edge seal 12 and the active circuitry area 14, but this is not depicted in FIG. 1 so as not to obscure the features of the present invention.

The die edge seal 12 may be of conventional physical design, formed of copper or a copper alloy and other capping metals, for example, and thus is not illustrated in detail. The die edge seal 12 may therefore be a wall of metal extending from the substrate up to the top of the copper/dielectric stack. The active circuitry 14 is circumferentially surrounded by this wall of metal forming the die edge seal 12.

Unfortunately, wafer sawing and package stresses can result in cracking or delaminating at the edge of the diced circuit. Cracks are particularly harmful when low k dielectrics are employed, since they exhibit reduced interfacial adhesion and increased susceptibility to ingress of moisture and/or air. Even without such cracks, water and air can diffuse through low k dielectrics. The moisture and air subject the copper in the die edge seal 12 to oxidation and eventual consumption, obviating the desired protection function of the die edge seal 12 for the active circuitry 14.

In order to prevent this oxidation and consumption, the present invention provides for negatively biasing the die edge seal 12. This is accomplished by connecting the die edge seal 12 to a source of negative electrical potential, with respect to electrical ground. In the embodiment of FIG. 1, a connection 18 connects the die edge seal 12 to a negative supply pad 16. A battery 20, mounted on a printed circuit board (PCB) 22, is connected to the negative supply pad 16.

The battery 20, serving as means for preventing oxidation of the die edge seal 12, supplies the negative electrical potential, with respect to electrical ground, that negatively biases the die edge seal 12. The value of the negative electrical potential can be selected by one of skill in the art, and can be, for example, in the range of 0.1 to 10 volts.

The negative biasing of the die edge seal 12, when made of copper or a copper alloy, for example, shifts the oxidation reaction potential of the copper to a region which is energetically unfavorable. For other metals used as a die edge seal and that are subject to oxidation, it is desirable to also shift the oxidation reaction potential to an energetically unfavorable region. Those of skill in the art will recognize these regions depending on the material employed in the die edge seal 12.

The shifting of the oxidation reaction potential for the die edge seal 12 significantly slows down, or even eliminates, the oxidation of the metal, such as copper, in the die edge seal 12. This, in turn, prevents the consumption of the die edge seal 12 when exposed to moisture and air, allowing the integrity of the die edge seal 12 to remain intact and maintain the protection of the active circuitry 14.

Figure 2:
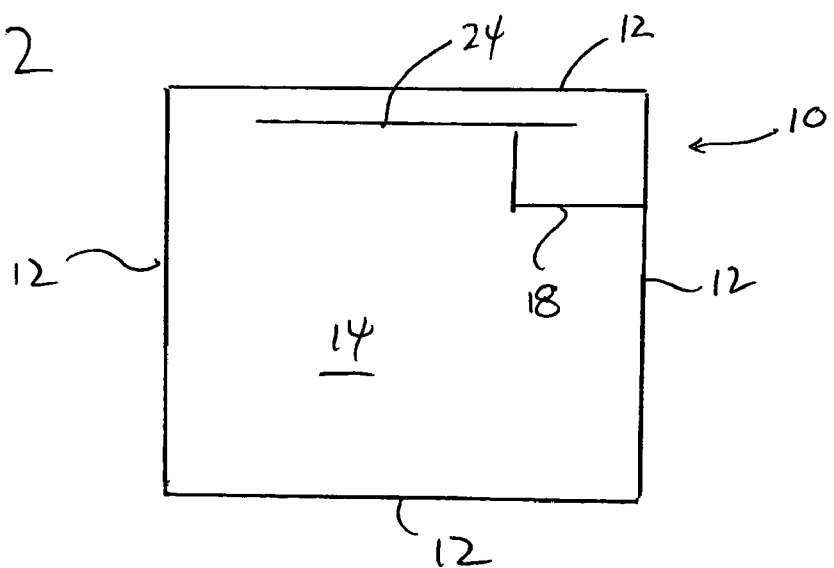
FIG. 2 is a top schematic view of a portion of a semiconductor device arrangement constructed in accordance with another embodiment of the present invention.

FIG. 2 depicts another embodiment of the present invention in which the source of negative electrical potential used to negatively bias the die edge seal 12 is a negative supply rail 24 located on the die 10. This obviates the need for an off-chip connection to a battery supply, and makes the biasing independent of a battery supply. The negative supply rail can therefore also serve as means for preventing oxidation of the die edge seal 12.

Figure 3A:
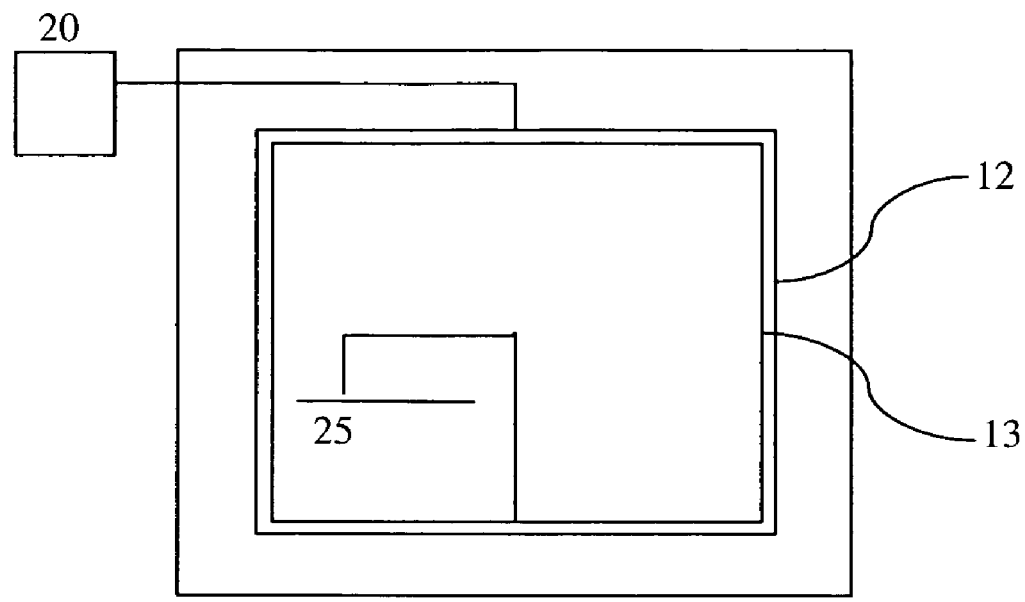
FIGS. 3a and 3b depict other embodiments of the present invention.
Figure 3B:
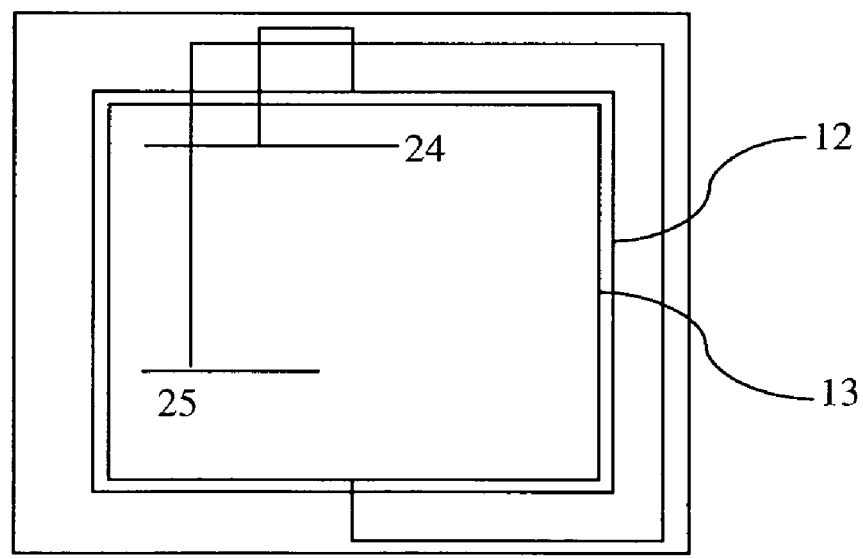

FIGS. 3a and 3b depict other embodiments of the present invention in which there are two die edge seals placed close together, and the outer seal 12 is negatively biased with respect to the inner seal 13. The source of negative electrical potential used to negatively bias the outer die edge seal 12 may be a battery 20 (FIG. 3a) or negative supply rail 24 located on the die 10, while the inner seal 13 is connected to ground 25 (FIG. 3b).

Each of the embodiments of FIGS. 1 and 2 depict only a single die edge seal 12. Multiple die edge seals can be employed (such as seen in FIGS. 3a and 3b, for example) without departing from the scope of the invention. However, by negatively biasing the die edge seal 12, the use of multiple and/or wide die edge seals can be avoided, since the single die edge seal 12 will not be consumed as a result of oxidation. This preserves the valuable area on the silicon wafer, and permits the area to instead be used for active circuitry, thereby increasing the yield of die per wafer.

In fabrication, the die edge seal 12 can potentially form a large antenna, contributing to device damage in plasma processes. Hence, it is preferable in certain embodiments to connect the die edge seal 12 to the negative biasing voltage source by final metal, and not at an earlier level.

The present invention provides an arrangement and methodology in which the oxidation of a die edge seal is largely prevented, or eliminated. This is achieved, in part, by negatively biasing the die edge seal, to shift the oxidation reaction potential to a region which is energetically unfavorable. The die edge seal is preserved, and is able to maintain its functionality as a protector of the active circuitry on the die from moisture and air. This allows a single die edge seal to be used, eliminating the need for multiple and/or wide die edge seals, increasing the area that can contain active circuitry, and therefore the yield of die per wafer.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A die edge seal arrangement for a semiconductor device, comprising:
    a metallic edge seal surrounding active circuitry on a die; and
    a source of negative electrical potential with respect to electrical ground coupled to the edge seal to negatively bias the edge seal.

2. The arrangement of claim 1, wherein the edge seal is made of copper.

3. The arrangement of claim 2, wherein the source of negative electrical potential is a negative supply rail of the semiconductor device.

4. The arrangement of claim 2, wherein the source of negative electrical potential is a battery.

5. The arrangement of claim 4, further comprising a printed circuit board (PCB) on which the die is mounted, the battery being mounted on the PCB.

6. The arrangement of claim 1, wherein the edge seal is made of a copper alloy.

7. A semiconductor device arrangement comprising:
    a die having a die edge seal; and
    means for preventing oxidation of the die edge seal.

8. A semiconductor device arrangement comprising:
    a die having a die edge seal; and
    means for preventing oxidation of the die edge seal, wherein the means for preventing oxidation includes means for negatively biasing the die edge seal.

9. The arrangement of claim 8, wherein the means for negatively biasing the die edge seal include a battery connected to the die edge seal.

10. The arrangement of claim 8, wherein the means for negatively biasing the die edge seal include a negative supply rail on the die, the negative supply rail being electrically connected to the die.

11. The arrangement of claim 8, wherein the die edge seal is made of copper.

* * * * *